United States Patent
Hidaka et al.

(10) Patent No.: US 12,510,491 B2
(45) Date of Patent: Dec. 30, 2025

(54) APPARATUS FOR INSPECTING SURFACE OF OBJECT

(71) Applicant: SAMSUNG ELECTRONICS CO., LTD., Suwon-si (KR)

(72) Inventors: Yasuhiro Hidaka, Kanagawa (JP); Ingi Kim, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 218 days.

(21) Appl. No.: 18/385,480

(22) Filed: Oct. 31, 2023

(65) Prior Publication Data

US 2024/0183796 A1 Jun. 6, 2024

(30) Foreign Application Priority Data

Dec. 5, 2022 (JP) .................................. 2022-193881

(51) Int. Cl.
*G01N 21/95* (2006.01)
*G01N 21/88* (2006.01)
(Continued)

(52) U.S. Cl.
CPC ..... *G01N 21/9505* (2013.01); *G01N 21/8806* (2013.01); *G02F 1/3546* (2021.01);
(Continued)

(58) Field of Classification Search
CPC ........... G01N 21/9505; G01N 21/8806; G01N 2021/8848; G01N 21/9501; G01N 21/88;
(Continued)

(56) References Cited

U.S. PATENT DOCUMENTS

| 6,788,405 B2 | 9/2004 | Hunt |
| 6,856,159 B1 | 2/2005 | Tolk et al. |

(Continued)

FOREIGN PATENT DOCUMENTS

| JP | 04-340404 | 11/1992 |
| JP | 05-142156 | 6/1993 |

(Continued)

OTHER PUBLICATIONS

Bloembergen, N. et. al., Light Waves at the Boundary of Nonlinear Media, Phys. Rev. 128, 606 (1962).

(Continued)

*Primary Examiner* — Md M Rahman
(74) *Attorney, Agent, or Firm* — Fish & Richardson P.C.

(57) ABSTRACT

In semiconductor inspection using second-harmonic generation within an object, a weak second-harmonic is detected at high sensitivity. In a semiconductor inspecting apparatus which irradiates a pulsed laser with a very short pulse width to a surface of a semiconductor device as the object, and measures the second-harmonic generated within the semiconductor device, a second-harmonic generation element is disposed between a light source and the object to generate a first second-harmonic. Further, the apparatus modulates a phase of only the first second-harmonic using an electric optical crystal, and then, a fundamental wave is irradiated onto the object. When the fundamental wave is irradiated onto the semiconductor device, the second-harmonic is generated therefrom. The first second-harmonic interferes with the second second-harmonic on a detector, and an intensity of the light obtained by the interfering is modulated at the same period as that of the phase modulation of the first second-harmonic. An amplitude of the second second-harmonic may be obtained from a modulated amplitude thereof, (Continued)

and a phase of the second second-harmonic may be measured from a modulated phase thereof.

20 Claims, 9 Drawing Sheets

(51) Int. Cl.
    *G02F 1/35*     (2006.01)
    *G02F 1/355*     (2006.01)
    *G02F 1/37*     (2006.01)
    *H01L 21/66*     (2006.01)

(52) U.S. Cl.
    CPC .............. *G02F 1/3551* (2013.01); *G02F 1/37* (2013.01); *H01L 22/12* (2013.01); *G01N 2021/8848* (2013.01)

(58) Field of Classification Search
    CPC .............. G01N 21/636; G01N 21/956; G01N 2021/4186; G01N 2021/637; G01N 2021/8845; G02F 1/3546; G02F 1/3551; G02F 1/37; H01L 22/12; H01L 22/10
    USPC ...................................................... 356/237.1
    See application file for complete search history.

(56) References Cited

U.S. PATENT DOCUMENTS

| | | |
|---|---|---|
| 10,551,325 B2 | 2/2020 | Koldiaev et al. |
| 10,613,131 B2 | 4/2020 | Koldiaev et al. |
| 10,816,480 B2 | 10/2020 | Jeang et al. |
| 11,293,965 B2 | 4/2022 | Koldiaev et al. |
| 2018/0217193 A1 | 8/2018 | Koldiaev et al. |

FOREIGN PATENT DOCUMENTS

| | | |
|---|---|---|
| JP | 05-226431 | 9/1993 |
| JP | 2518547 | 5/1996 |
| JP | 2004529327 A | 9/2004 |
| JP | 2015008284 | 1/2015 |
| JP | 2021522686 | 8/2021 |
| JP | 2021530670 | 11/2021 |
| JP | 2021531641 | 11/2021 |

OTHER PUBLICATIONS

Guidotti, D. et.al, Second harmonic generation in centro-symmetric semiconductors, Solid state communications 46.4 (1983): 337-340.

FIG. 1
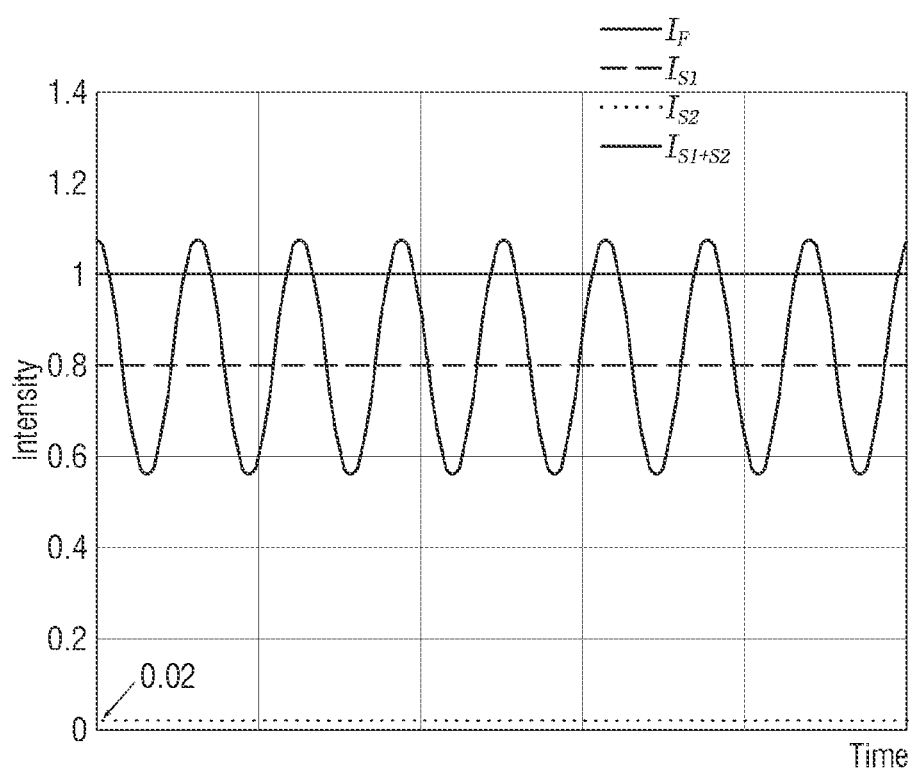
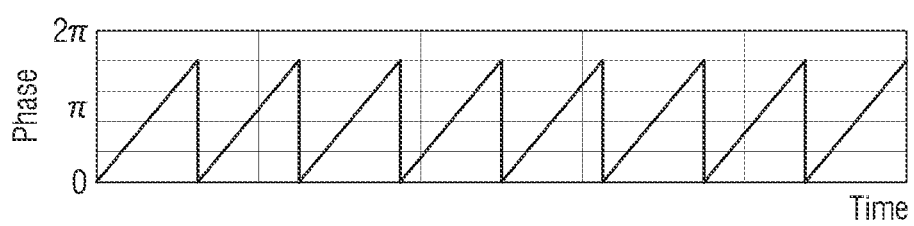

FIG. 8
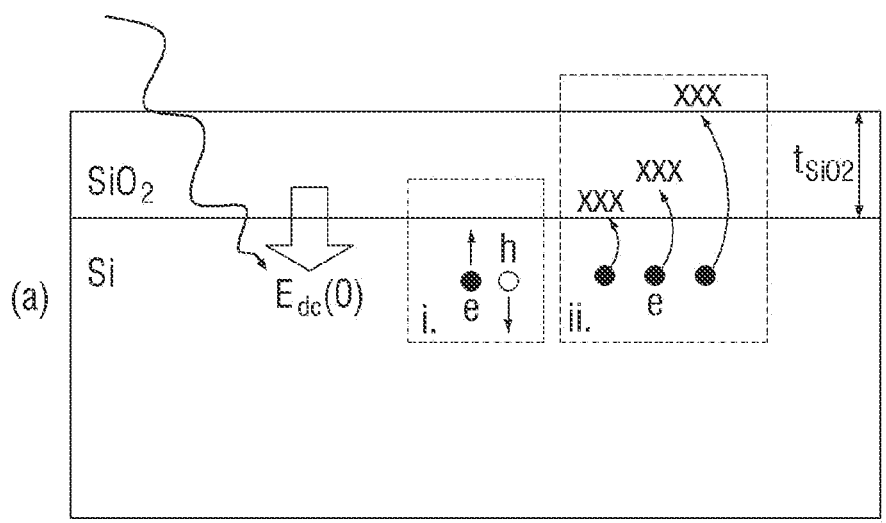
(a)
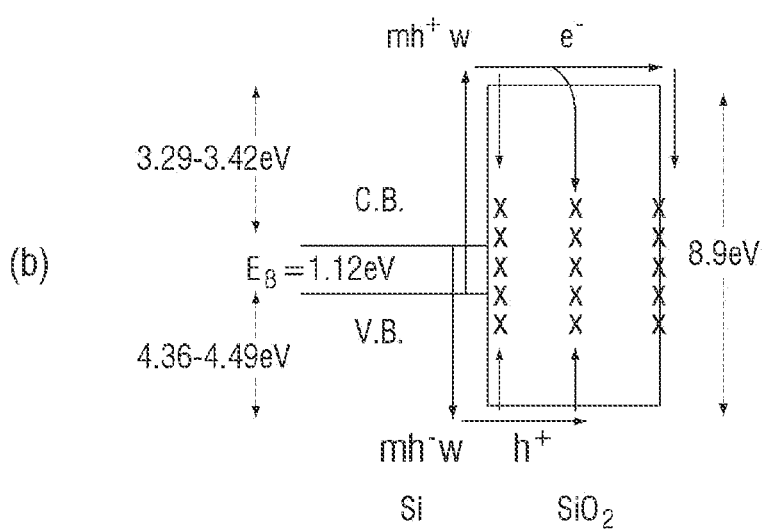
(b)

APPARATUS FOR INSPECTING SURFACE OF OBJECT

CROSS-REFERENCE TO RELATED APPLICATION

A claim of priority is made to Japanese Patent Application No. 2022-193881, filed on Dec. 5, 2022, in the Japanese Intellectual Property Office, and all the benefits accruing therefrom under 35 U.S.C. 119, the disclosure of which in its entirety is herein incorporated by reference.

BACKGROUND

The present disclosure relates to a technology that irradiates a pulsed laser onto a semiconductor device and measures a second-harmonic generated near a semiconductor surface or a boundary surface, in order to measure contamination of the semiconductor surface and an amount of dopants in the semiconductor, or internal twist therein, during a manufacturing process of a semiconductor device.

In the field of semiconductor device manufacturing, until relatively recently miniaturization of circuit patterns was the evolutionary focus. Such miniaturization simultaneously resulted in improved operational speeds and reduced power consumption, as well as reduced costs. However, as the technical barriers to further miniaturization increase, and the devices are three-dimensionally structured, the evolutionary focus has shifted to the introduction of new materials such as High-K/Low-K materials, to improvements in electron mobility by the intentional addition of twist during epitaxial growth, and to performance improvements achieved by controlling various physical properties. As such, high-precision and high-throughput physical property measurement has become desirable for both process establishment in research and development and improvement of product yield in mass production. For example, physical property measurements may include the measurement of the amount and spatial distribution of dopants in an ion implantation process, a reactivated state after annealing, and an amount of internal twist in a selective epitaxial growth process of, e.g., SiGe.

However, these physical properties cannot be evaluated using a physical measurement apparatus such as OCD (Optical Critical Dimension) or CD-SEM (Critical Dimension-Scanning Electron Microscope). They can be evaluated using chemical measurement methods using fluorescence X-ray or mass spectrometry in a precise manner but at a low throughput, and in some cases, in a destructive manner. In contrast thereto, using electrical characteristic inspection as another approach, it may be difficult to inspect a transistor with a MOS (Metal-Oxide-Silicon) structure as a basic component. This approach evaluates electrical characteristics such as C-V (Capacitance-Voltage) characteristics by electrically connecting a probe thereto. The above inspection schemes involve direct performance evaluations of the semiconductor device. LADA (Laser-Assisted Device Alteration) and OBIRCH (Optical Beam Induced Resistance Change) may irradiate light to the semiconductor device to identify defects, as well as identify margins related to the defects or locations of high resistance within the device.

However, LADA and OBIRCH are contact-type measurement schemes, and thus, cannot be employed unless a semiconductor post-process where a wiring layer or a pad is formed has been performed. When these electrical characteristics can be identified in a non-contact manner in a semiconductor front-process, and as a result, diffusion of a depletion layer or an inversion area formed inside the semiconductor may be accurately analyzed, this may provide rapid feedback to a process such as ion implantation or annealing, and may be very effective in shortening a development period or a manufacturing cycle time. However, there is still no established measurement technology that meets this need.

One of the non-contact electrical characteristic measurement technologies that has the potential to meet the above need is inspection using second-harmonic generation based on nonlinear optical characteristics of a measurement target. The nonlinear optical characteristics may be expressed as a product of susceptibility and an electric field as shown in a following Equation 1, and the susceptibility may be known based on an intensity of the second-harmonic. Furthermore, a band structure in the material is obtained from each element of a susceptibility tensor. A major material constituting the semiconductor substrate, such as silicon, has a reversal-symmetric crystal structure and does not usually generate the second-harmonic in a bulk state:

Equation 1

$$P_i = \varepsilon_0 \left( \sum_{i=x,y,z} \chi_{ij}^{(1)} E_j + \sum_{j,k=x,y,z} \chi_{ijk}^{(2)} E_j E_k + \sum_{j,k,l=x,y,z} \chi_{ijkl}^{(3)} E_j E_k E_l + \ldots \right) \quad (1)$$

However, in Non-Patent Document 1, Bloembergen et al. conducted a theoretical review of second-harmonic generation as the symmetry disappears at a boundary surface of the material. With the subsequent development of pulsed lasers, this was evaluated in a quantitative experimental manner.

Furthermore, in Non-Patent Document 2, Guidotti et al. experimentally evaluated the generation of the second-harmonic on a silicon surface with the reversal-symmetric structure. In Patent Document 1, there is a proposal of a measurement scheme using the second-harmonic regarding a progress of the process within the semiconductor process apparatus. In Patent Document 2, a method was proposed to evaluate the presence of contaminants on the surface of the semiconductor substrate based on an observing result of the second-harmonic generated under illumination of light of multiple wavelengths, and the summation of frequencies.

Furthermore, in Patent Document 3, a band structure analysis method using the process in which the second-harmonic changes temporally, due to screening and charging by photoelectrons generated under illumination, and the measurement result thereof was proposed. In Patent Document 4, there was a proposal for a method of detecting defects with no sensitivity to the fundamental wave, based on an observing result of both the fundamental wave and the second-harmonic in the semiconductor inspecting apparatus.

In this way, there have been several important technological advancements in semiconductor manufacturing. Further, what has become more practical is the invention as described by Viktor Kodie (et al.) in Patent Document 5 in which under the UV (Ultra Violet) illumination light that is separate from the fundamental wave, screening and charging are saturated before measurement and then, the measurement of the second-harmonic is completed in a short period of time.

Patent Document 6 further improvises the technology and increases the resolution of the time-based change measurement of the second-harmonic using a delay mechanism, and then installs an electric field addition function on a wafer holder and applies an external electric field to the wafer.

Furthermore, Patent Document 7 illuminates the object using fundamental waves of multiple wavelengths and measures third-order nonlinear phenomena including four-wave mixing. Furthermore, Patent Document 8 performs analysis of the polarization state of the second-harmonic generated from the wafer and performs measurement while the influence of electrical characteristics is separated from the influence of twist or crystallization state. Furthermore, Patent Document 9 proposes a practical test pattern structure for measurement in consideration of the actual semiconductor manufacturing process.

FIG. 8 is a diagram showing interaction when laser light is incident on silicon and a $SiO_2$ thin film. As shown in FIG. 8, the electrons in the valence band of silicon are excited to generate the second-harmonic, and, furthermore, following four processes occur: as in (i), electron-hole pairs are generated in silicon; as in (ii), photoelectrons fill the trap at the boundary between silicon and the $SiO_2$ thin film; as in (ii), photoelectrons fill the defect site in the $SiO_2$ thin film; and as in (ii), electrons jump to the oxygen conduction band of the $SiO_2$ surface. These processes change the internal electric field $E_{dc}$, thereby causing the temporal change in the second-harmonic intensity.

FIG. 9 is a diagram showing a configuration of an optical system of a semiconductor inspecting apparatus using related second-harmonic generation. A semiconductor inspecting apparatus 900 includes an isolator 903, an intensity modulation element 904, a mirror 910, a polarizer 911, a first light-condensing lens 912, an object 913, and a second light-condensing lens 914, a polarizer 916, a short path filter 917, and a detector 918. The semiconductor inspecting apparatus 900 projects a fundamental wave 902 of femtosecond laser 901 onto a sample, and measures an amount of light of a second-harmonic 915 generated from the object 913.

The document numbers referenced above are identified below.

Non-Patent Document 1: BLOEMBERGEN, N. et. al., Light Waves at the Boundary of Nonlinear Media, Phys. Rev. 128, 606 (1962)

Non-Patent Document 2: Guidotti, D. et. al, Second harmonic generation in centro-symmetric semiconductors, Solid state communications 46.4(1983):337-340.

Patent Document 1: Japanese Patent Application Publication No. 1992-340404

Patent Document 2: U.S. Pat. No. 6,788,405

Patent Document 3: U.S. Pat. No. 6,856,159

Patent Document 4: Japanese Patent Application Publication No. 2004-529327

Patent Document 5: US Patent Application Publication No. 2018/0217193

Patent Document 6: U.S. Pat. No. 11,293,965

Patent Document 7: Japanese Patent Application Publication No. 2021-522686

Patent Document 8: Japanese Patent Application Publication No. 2021-530670

Patent Document 9: Japanese Patent Application Publication No. 2021-531641

SUMMARY

However, in crystal or amorphous material with the reversal-symmetry structure such as silicon, in principle, the second-harmonic is generated only in a few layers of atoms at a material surface or a boundary surface. Thus, detection of the second-harmonic using a photon counting device such as a photomultiplier is essential. Therefore, measurement on one location requires a time of several seconds, and the performance of the in-situ inspecting and measuring apparatuses in semiconductor manufacturing is completely insufficient. For this reason, an attempt is made to increase the amount of the detected light by improving the peak output or average output of the pulsed laser as the illumination light of the fundamental wave. However, this may cause damage to the silicon as the measurement target. Therefore, in order to shorten the measurement time, it is necessary not to change the peak output or average output of the illumination light but to increase the detection sensitivity.

Using the illuminating light of the fundamental wave, the first second-harmonic is generated in a location other than the semiconductor wafer as the measurement target, and phase modulation is also added thereto. When the second second-harmonic generated from the semiconductor wafer interferes with the first second-harmonic to obtain the interfered light, intensity modulation occurs on the interfered light at the same frequency as that of the phase modulation added to the first second-harmonic. The amplitude of the intensity modulation may be measured and the amplitude of the second-harmonic is obtained based on the measurement.

The following Equations (2), (3), and (4) represent an electric field $E_F$ of the fundamental wave, an electric field $E_{S1}$ of the first second-harmonic, and an electric field $E_{S2}$ of the second second-harmonic, respectively. The following Equation (5) represents each of intensities $I_F$, $I_{S1}$, and $I_{S2}$ of the fundamental wave, the first second-harmonic, and the second second-harmonic. The intensity is the amplitude$^2$. The Equation (4) expressing the electric field $E_{S2}$ of the second-harmonic includes a term corresponding to the phase change, that is, $\phi(t)$ which is a function of a time.

Equation 2

$$E_F = |E_F| \cdot \exp\{i(wt-kr)\} \qquad (2)$$

Equation 3

$$E_{s1} = |E_{s1}| \cdot \exp\{i(wt-kr)\} \qquad (3)$$

Equation 4

$$E_{s2} = |E_{s2}| \cdot \exp\{i(wt-kr+\varphi(t))\} \qquad (4)$$

Equation 5

$$I_F = |E_F|^2, I_{S1} = |E_{s1}|^2, I_{S2} = |E_{S2}|^2 \qquad (5)$$

A following Equation (6) represents the intensity of the interfered light obtained by interfering the first second-harmonic and the second second-harmonic with each other. First and second terms are the DC components without time dependence, and a third term is the AC component that changes over time as indicated by $\phi(t)$. The amplitude of the observed AC component is expressed as $2 \cdot |E_{S1}||E_{S2}|$. $|E_{S1}|$ may be pre-measured via calibration, etc., and $|E_{S2}|$ may be calculated therefrom.

Equation 6

$$I_{S1+S2} = |E_{S1}|^2 + |E_{S2}|^2 + 2 \cdot |E_{S1}||E_{S2}| \cdot \cos(i\varphi(t)) \qquad (6)$$

In this regard, $I_{S2} = |E_{S2}|^2$ is observed in conventional measurement technology. However, $I_{S2} = |E_{S2}|^2$ is small because the electric field $E_{S2}$ is weak. On the other hand, it becomes possible to observe an appropriate amount of light by setting the AC component of the interfered light, that is, $2 \cdot |E_{S1}||E_{S2}| \cdot \cos(i\phi(t))$, and the electric field $E_{S1}$ to be large.

FIG. 1 is a diagram showing an improved example of a detected signal by a method in accordance with the present disclosure.

As shown in FIG. 1, assuming that $I_F=1$, $I_{S1}=0.8$, and $I_{S2}=0.02$, the detected signal is $I_{S2}$, which is very small in the conventional method. According to the present disclosure, the detected signal becomes $I_{S1+S2}$, and the AC component thereof is 0.25, and a signal intensity greater by at least 10 times can be obtained.

The intensity of $I_{S1}$ may be set arbitrarily, and thus may be set appropriately based on the intensity of $I_{S2}$. Thus, in any case, it is possible to obtain $I_{S1+S2}$ as great times of $I_{S2}$.

According to the present disclosure, in the semiconductor inspection using second-harmonic generation within the object, weak second-harmonic can be detected at high sensitivity.

BRIEF DESCRIPTION OF DRAWINGS

The above and other aspects and features of the present disclosure will become more apparent by describing in detail illustrative embodiments thereof with reference to the attached drawings, in which:

FIG. 1 is a diagram showing an improved example of a detected signal by a method in accordance with the present disclosure;

FIG. 8 is a diagram showing interaction when laser light is incident on silicon and a $SiO_2$ thin film.

DETAILED DESCRIPTIONS

Hereinafter, embodiments (numbered 1 through 5) of the inventive concepts will be described with reference to the drawings. However, the invention concepts are not limited to the following embodiments. Furthermore, not all of components as described in the embodiments should be considered essential as means to achieve the purposes of the inventive concepts. Throughout the drawings, like elements are identified by like symbols, and redundant descriptions of previously described elements are omitted where possible.

Figure 2:
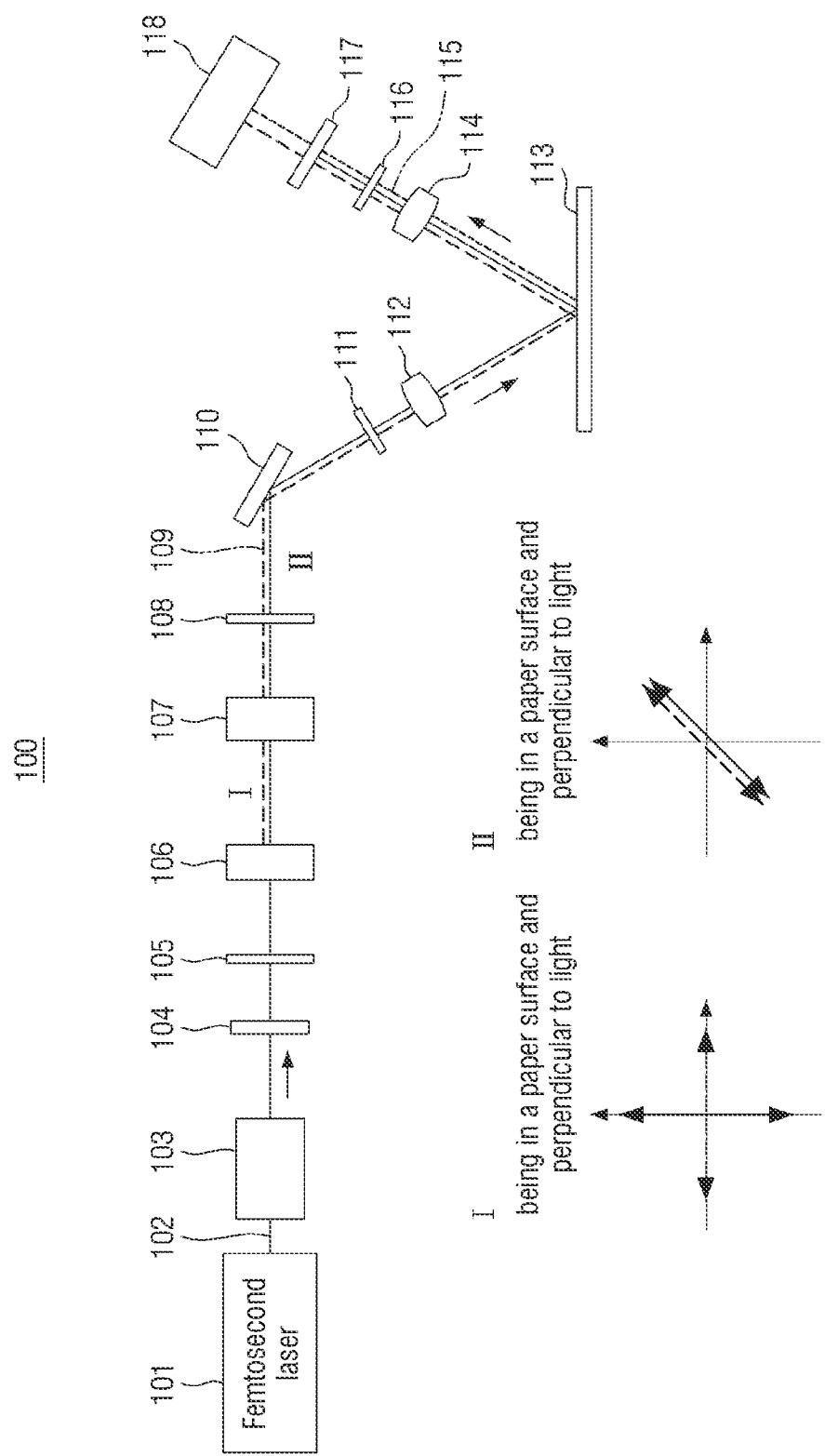
FIG. 2 is a diagram showing a configuration of an optical system of a semiconductor inspecting apparatus according to embodiment 1.
Figure 3:
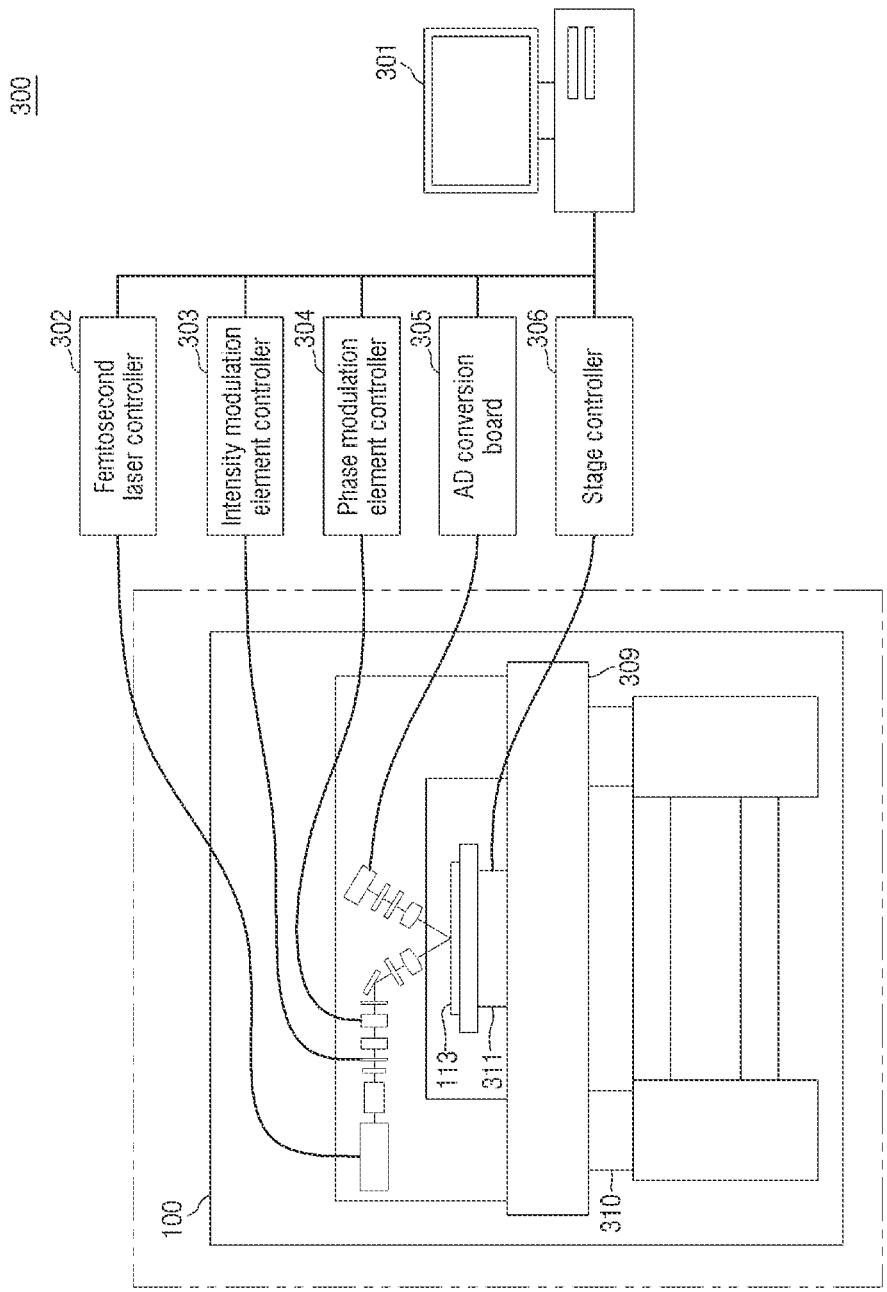
FIG. 3 is a schematic diagram showing a configuration of a semiconductor inspecting apparatus according to embodiment 1.

FIG. 2 is a diagram showing a configuration of an optical system of the semiconductor inspecting apparatus according to embodiment 1. FIG. 3 is a schematic diagram showing a configuration of the semiconductor inspecting apparatus according to embodiment 1. Referring to FIG. 2 and FIG. 3, the semiconductor inspecting apparatus according to embodiment 1 is described.

As shown in FIG. 2, an optical system 100 of the semiconductor inspecting apparatus according to embodiment 1 includes a light source, a second-harmonic generation element 106, a phase modulation element 107, an object 113, a lighting optical system, a light-receiving optical system, and a detector 118.

The light source is embodied as, for example, a femtosecond laser 101 in a femtosecond range with a pulse width of 1 picosecond or smaller. The femtosecond laser may use a Ti:Sapphire laser.

A nanosecond laser with a pulse width in a nanosecond range and a picosecond laser with a pulse width in a picosecond range may be used. However, it is preferable that the pulse width is shorter in order to efficiently generate the second-harmonic. For example, the femtosecond laser 101 emits a fundamental wave of pulsed laser light 102 with a predetermined wavelength in a range of 660 nm to 1100 nm.

The fundamental wave of the pulsed laser light 102 passes through the second-harmonic generation element 106 which in turn generates a first second-harmonic 109 having twice a frequency of the fundamental wave, that is, having a half of a wavelength of the fundamental wave. The second-harmonic generation element 106 is preferably embodied as a nonlinear optical crystal that satisfies a phase matching condition of a type I. The nonlinear optical crystal that satisfies the phase matching condition of the type I may include, for example, LBO (lithium triborate), BBO (barium beta borate), and KTP (potassium titanate phosphate).

The phase modulation element 107 modulates a phase of the first second-harmonic 109 at a predetermined frequency. The phase modulation element 107 is generally embodied as an EOM (Electro-Optical Modulator (electrical optical element)) based on the principle of the Pockels effect. In this case, a phase of only one side polarized light is modulated. The phase modulation element 107 may be an element using, for example, $LiNbO_3$ (lithium niobate). In this regard, the phase modulation element 107 may be oriented so that a polarization direction subjected to the phase modulation becomes that of the first second-harmonic, such that a phase of the fundamental wave is not modulated, and only a phase of the first second-harmonic 109 is modulated.

The object 113 is, for example, a semiconductor substrate with a $SiO_2$ film formed on its surface. Alternatively, the object 113 is a semiconductor element under a manufacturing process. When the pulsed laser light 102 is irradiated to the object 113, a second second-harmonic 115 is generated from the object 113 due to a nonlinear optical effect within the object. The second second-harmonic 115 may be generated depends on a thickness of the $SiO_2$ film of the semiconductor substrate as the object 113, a metal contamination of $SiO_2$, the number of defects at a boundary between the $SiO_2$ film and a substrate body, an amount of dopants (impurities) in the semiconductor substrate, and a recrystallization state of the semiconductor substrate.

The lighting optical system radiates the pulsed laser light 102 to a predetermined location on the surface of the object 113.

The lighting optical system includes, for example, a third linear polarizer 111 and a first light-condensing lens 112.

The lighting optical system radiates the pulsed laser light 102 to a predetermined location on the surface of an object 113. The third linear polarizer 111 changes the fundamental wave of the pulsed laser light 102 so that a polarization state of the illumination light with high sensitivity is achieved by the semiconductor device as the measurement target. The first light-condensing lens 112 condenses the fundamental wave of the pulsed laser light 102 at a measurement point of the object 113. A light-condensing optical element is positioned in the lighting optical system so that the pulsed laser light 102 is focused on the surface of the object 113.

The light-receiving optical system allows the first second-harmonic 109 and second second-harmonic 115 to be incident on the detector 118 while the first second-harmonic 109 and second second-harmonic 115 are coaxial with each other. The light-receiving optical system include a second light-condensing lens 114 and a fourth linear polarizer 116. The second light-condensing lens 114 converts the first second-harmonic 109 and the second second-harmonic 115 into parallel light with each other. The fourth linear polarizer 116 allows a polarization direction of the first second-harmonic 109 and a polarization direction of the second second-harmonic 115 to be the same as each other. As a result, the first second-harmonic 109 and the second second-harmonic 115 have the same wavelength and are coherent with each other and thus interfere with each other.

The detector 118 receives the first second-harmonic 109 and the second second-harmonic 115 and converts the first second-harmonic 109 and the second second-harmonic 115 into an electrical signal. The detector 118 may be embodied as, for example, a semiconductor detector photodiode (PD), an avalanche photodiode (APD), or a photomultiplier (PM).

The optical system 100 of the semiconductor inspecting apparatus includes the optical element. In particular, the second-harmonic generation element 106 and phase modulation element 107 are disposed in the lighting optical system. However, the order in which the components are arranged may be changed as shown in embodiments 2 to 5.

Referring to FIG. 2, the behavior of the pulsed laser light 102 according to the optical system 100 of the semiconductor inspecting apparatus according to embodiment 1 is described. First, the pulsed laser light 102 emitted from the light source passes through the isolator 103 configured to remove returned light. The pulsed laser light then passes through the intensity modulation element 104. This intensity modulation element 104 may be embodied as an optical chopper, a combination of a linear polarizer and an EOM, a liquid crystal shutter, or an acousto-optic modulator (AOM). The intensity modulation element 104 may adopt any element that changes the intensity of the pulsed laser light 102.

Then, the pulsed laser light 102 passes through the first linear polarizer 105 and thus is linearly polarized. Next, the pulsed laser light 102 passes through the second-harmonic generation element 106 which in turn generates the second-harmonic.

In the pulsed laser light that has passed through the second-harmonic generation element, a polarization direction of the fundamental wave and a polarization direction of the first second-harmonic are perpendicular to each other as shown in I. Subsequently, the fundamental wave of the pulsed laser light 102 and the first second-harmonic 109 pass through the phase modulation element 107. In this regard, the polarization direction subjected to the phase modulation becomes the polarization direction of the first second-harmonic 109. Thus, the phase of the fundamental wave is not modulated, and only the phase of the first second-harmonic 109 is modulated.

Furthermore, the fundamental wave of the pulsed laser light 102 and the first second-harmonic 109 pass through the second linear polarizer 108. Thus, as shown in II, the polarization direction of the fundamental wave and the polarization direction of the first second-harmonic 109 coincide with each other. An orientation of a transmission axis of the second linear polarizer 108 is set so that a ratio of an intensity of the fundamental wave and an intensity of the first second-harmonic 109 is optimal.

Subsequently, the fundamental wave and the first second-harmonic 109 are reflected from a mirror 110 and then pass through the third linear polarizer 111. Subsequently, the fundamental wave and the first second-harmonic 109 pass through the first light-condensing lens 112 and thus are focused on the object 113. As the fundamental wave of the pulsed laser light 102 is irradiated on the object 113, the second second-harmonic 115 whose an intensity and a phase depend on a material, a structure, and an electric field state in the semiconductor device as the object 113 is generated. Furthermore, a significant portion of the fundamental wave of the pulsed laser light 102 and the first second-harmonic 109 are reflected from the surface of the object 113.

The generated second second-harmonic 115 passes through the same optical path as the optical path through which the fundamental wave of the pulsed laser light 102 and the first second-harmonic 109 reflected from the object 113 pass through. Then, while the generated second second-harmonic 115, the fundamental wave of the pulsed laser light 102, and the first second-harmonic 109 pass through the second light-condensing lens 114, they are converted to parallel light. The second second-harmonic 115 and the first second-harmonic 109 pass through the fourth linear polarizer 116, such that the polarization direction of the second second-harmonic 115 and the polarization direction of the first second-harmonic 109 coincide with each other. As a result, the first second-harmonic 109 and the second second-harmonic 115 have the same wavelength and are coherent with each other, and thus interfere with each other. Furthermore, the fundamental wave of the pulsed laser light 102, the first second-harmonic 109, and the second second-harmonic 115 are irradiated to the short path filter 117 where the fundamental wave is removed by the short path filter 117. Finally, the interfered light obtained when the first second-harmonic 109 and the second second-harmonic 115 interfere with each other is incident on the detector 118. The disclosed short path filters can also be referred to as short pass filters.

The intensity of the obtained interfered light is modulated at the same period as that of the phase modulation of the first second-harmonic 109. From a modulated amplitude thereof, an amplitude of the second second-harmonic 115 may be obtained. From the modulated phase thereof, a phase of the second second-harmonic 115 may be measured. In this regard, although the amplitude of the second second-harmonic 115 is very weak, appropriately setting an electrical signal intensity of the first second-harmonic 109 may allow the intensity modulation of the interfered light to be large, such that the second second-harmonic 115 can be measured at good sensitivity.

An optical distance from the light source to the detector 118 along which the pulsed laser light 102 and the first second-harmonic 109 travel may be equal to an optical distance from the light source to the detector 118 along which the pulsed laser light 102 and the second second-harmonic 115 travel.

A signal obtained from the detector 118 amounts to $I_{S1}+I_{S2}$ due to the phase modulation element 107. The detector 118 converts each of the first second-harmonic 109 and the second second-harmonic 115 into an analog electrical signal proportional to an amount of light thereof. This analog electrical signal is lock-in detected at the modulation frequency of the phase modulation element 107 by the detector 118.

As shown in FIG. 3, a semiconductor inspecting apparatus 300 includes the optical system 100 of the semiconductor inspecting apparatus, an information processing device 301, a femtosecond laser controller 302, an intensity modulation element controller 303, a phase modulation element controller 304, an AD conversion board 305, and a stage controller 306.

The optical system 100 of the semiconductor inspecting apparatus is installed on a vibration cancellation board. The vibration cancellation board includes an optical surfaceplate 309 and an isolator 310.

The information processing device 301 includes a CPU (Central Processing Unit), a memory, storage, etc. The CPU of the information processing device 301 executes a program stored in the storage and the memory to control the femtosecond laser controller 302, the intensity modulation element controller 303, the phase modulation element controller 304, the AD conversion board 305, and the stage controller 306.

The femtosecond laser controller 302 is connected to the femtosecond laser 101 and controls the femtosecond laser 101. The femtosecond laser controller 302 controls the pulsed laser light 102, that is, a pulse width, an oscillation wavelength, and an oscillation period thereof, and oscillation synchronized with the detector 118.

The intensity modulation element controller 303 is connected to the intensity modulation element 104. The intensity modulation element controller controls the intensity modulation element 104 to modulate the intensity of the pulsed laser light 102.

The phase modulation element controller 304 is connected to the phase modulation element 107. The phase modulation element controller 304 controls the phase modulation element 107 to modulate the phase of the first second-harmonic. The phase modulation element controller 304 synchronizes the phase modulation element 107 with the detector 118 to control the detector 118 to perform the lock-in detection.

The AD conversion board 305 is connected to the detector 118. The AD conversion board converts the analog signal received from the detector 118 into a digital signal. A waveform is analyzed on the information processing device 301 to obtain an amplitude of $I_{S1+S2}$ which is applied to the above Equation 6 to obtain |ES2|.

The stage controller 306 is connected to a wafer stage 311 on which the object 113 is placed. The stage controller 306 controls the wafer stage 311 to change a condensing position on the object 113. The object 113 may be fixed onto a wafer holder with a vacuum chuck, and the wafer holder may move a measurement point using the wafer stage 311.

The thickness of the $SiO_2$ film of the semiconductor surface of the semiconductor substate as the object 113, the metal contamination of $SiO_2$, the amount of defects at the boundary between $SiO_2$ and the substrate, the amount of dopant (impurities) in the semiconductor substrate, and the recrystallized state of of the semiconductor substrate are calculated based on an analysis result of the intensity of the second-harmonic.

In this way, in the semiconductor inspection using the second-harmonic generation in the object, weak second-harmonic can be detected at high sensitivity. In the second-harmonic measurement which can measure a surface contamination and an internal dopant amount of the semiconductor device during manufacturing thereof, the intensity of the detected signal has been dramatically improved. A measurement time can be reduced from a conventional time, that is, 1 to 10 seconds taken for one point measurement by one to several orders of magnitude. Thus, a larger number of semiconductor wafers may be measured in the same unit time. Furthermore, when this high throughput is applied to distribution in a wafer surface, several measurement points within the wafer which are conventionally measured for the same time duration may be increased to about 100 measurement points in an entire exposure shot. Further, feedback precision of the process is greatly improved.

Figure 4:
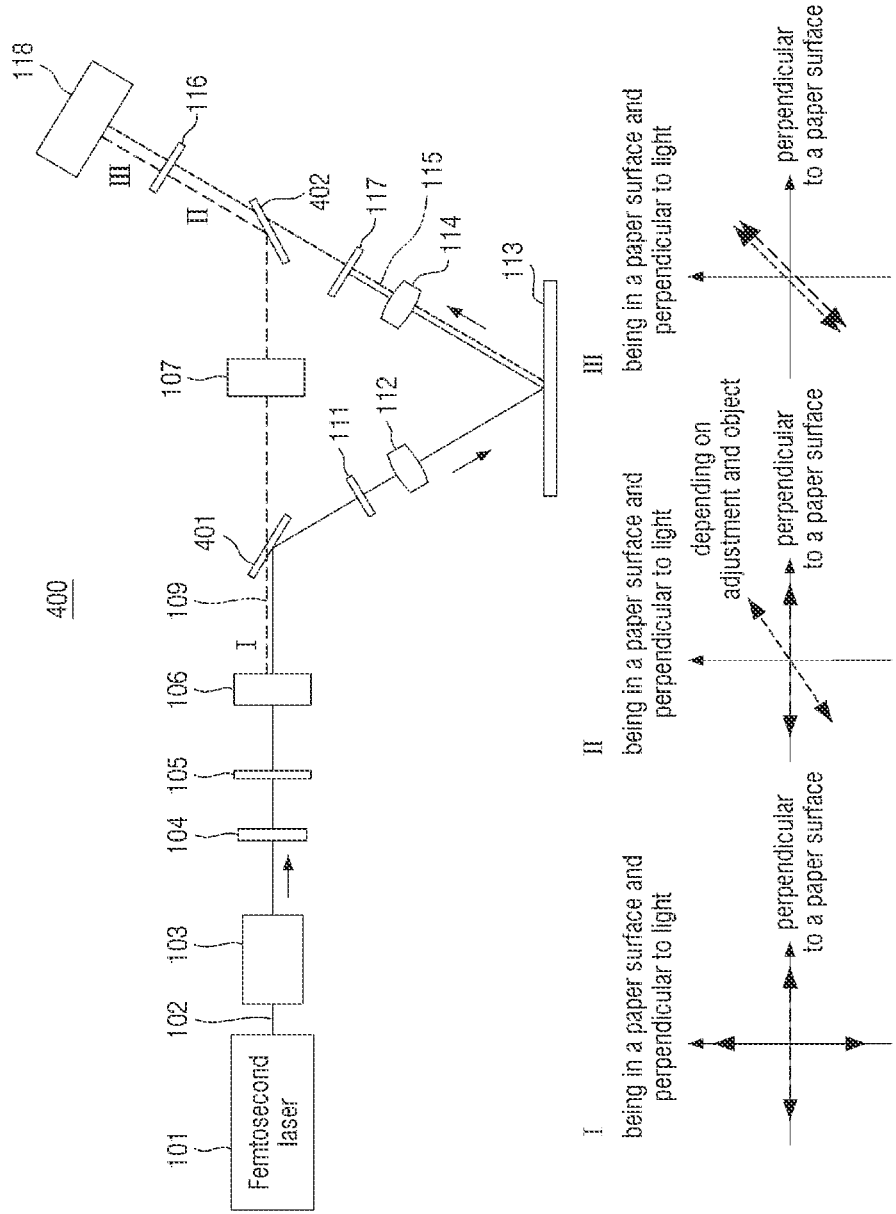
FIG. 4 is a diagram showing a configuration of an optical system of a semiconductor inspecting apparatus according to embodiment 2.

FIG. 4 is a diagram showing a configuration of an optical system of a semiconductor inspecting apparatus according to embodiment 2. Referring to FIG. 4, the optical system of the semiconductor inspecting apparatus according to embodiment 2 is described.

As shown in FIG. 4, an optical system 400 of the semiconductor inspecting apparatus according to embodiment 2 is different from the optical system 100 of the semiconductor inspecting apparatus according to embodiment 1 in that the first second-harmonic 109 is separated from the fundamental wave of the pulsed laser light 102 by a beam splitter 401 before the fundamental wave is projected onto the object 113. The first second-harmonic 109 is separated from the fundamental wave of the pulsed laser light 102 by the beam splitter 401, and then is incident on the phase modulation element 107, and is synthesized with the second second-harmonic 115 by a half mirror 402.

The optical system 400 of the semiconductor inspecting apparatus according to embodiment 2 includes the femtosecond laser 101, the isolator 103, the intensity modulation element 104, the first linear polarizer 105, the second-harmonic generation element 106, the beam splitter 401, the third linear polarizer 111, the first light-condensing lens 112, the object 113, the second light-condensing lens 114, the short path filter 117, the half mirror 402, the fourth linear polarizer 116, and the detector 118. The description of the components of the optical system identical with the components of the optical system of embodiment 1 is omitted.

The beam splitter 401 is a polarizing beam splitter that separates the fundamental wave of the pulsed laser light 102 and the first second-harmonic 109 from each other. The beam splitter 401 may be a dichroic mirror.

The half mirror 402 combines the first second-harmonic 109 and second second-harmonic 115 with each other. The half mirror 402 has a transmittance exceeding 50%, and does not cause loss of the weak second second-harmonic 115.

Since only the first second-harmonic 109 is incident on the phase modulation element 107, the phase modulation element 107 may be embodied as MEMS (Micro Electro Mechanical Systems) that does not have polarization dependence.

As shown in FIG. 4, at a time point I when the first second-harmonic 109 has been generated, the polarization direction of the fundamental wave and the polarization direction of the first second-harmonic 109 are perpendicular to each other. At a time point II when the first second-harmonic 109 and the second second-harmonic 115 have been synthesized with each other, the polarization direction of the second second-harmonic 115 depends on the adjustment or the object 113. At a time point III when the first second-harmonic 109 and the second second-harmonic 115 have passed through the fourth linear polarizer 116, the polarization direction of the first second-harmonic 109 and the polarization direction of the second second-harmonic 115 are aligned with each other. As a result, the first second-harmonic 109 and the second second-harmonic 115 have the same wavelength and are coherent with each other and thus interfere with each other.

In the optical system 400 of the semiconductor inspecting apparatus according to embodiment 2, the second-harmonic generation element 106 is disposed in the lighting optical system. The first second-harmonic 109 generated from the second-harmonic generation element 106 is separated from the fundamental wave of the pulsed laser light 102 of the predetermined wavelength by the beam splitter 401. The separated fundamental wave of the pulsed laser light 102 of the predetermined wavelength is irradiated to the surface of the object 113.

The separated first second-harmonic 109 passes through the phase modulation element 107. The first second-harmonic 109 having passed through the phase modulation element 107 is brought into being coaxial with the second second-harmonic 115 generated from the surface of the object 113 by the beam splitter (half mirror 402), and then both are incident on the detector 118.

Using the optical system 400 of the semiconductor inspecting apparatus according to embodiment 2, the drawback that the first second-harmonic 109 changes the electric field state of the semiconductor device as the object 113 to complicate the interpretation of the result may be avoided.

Figure 5:
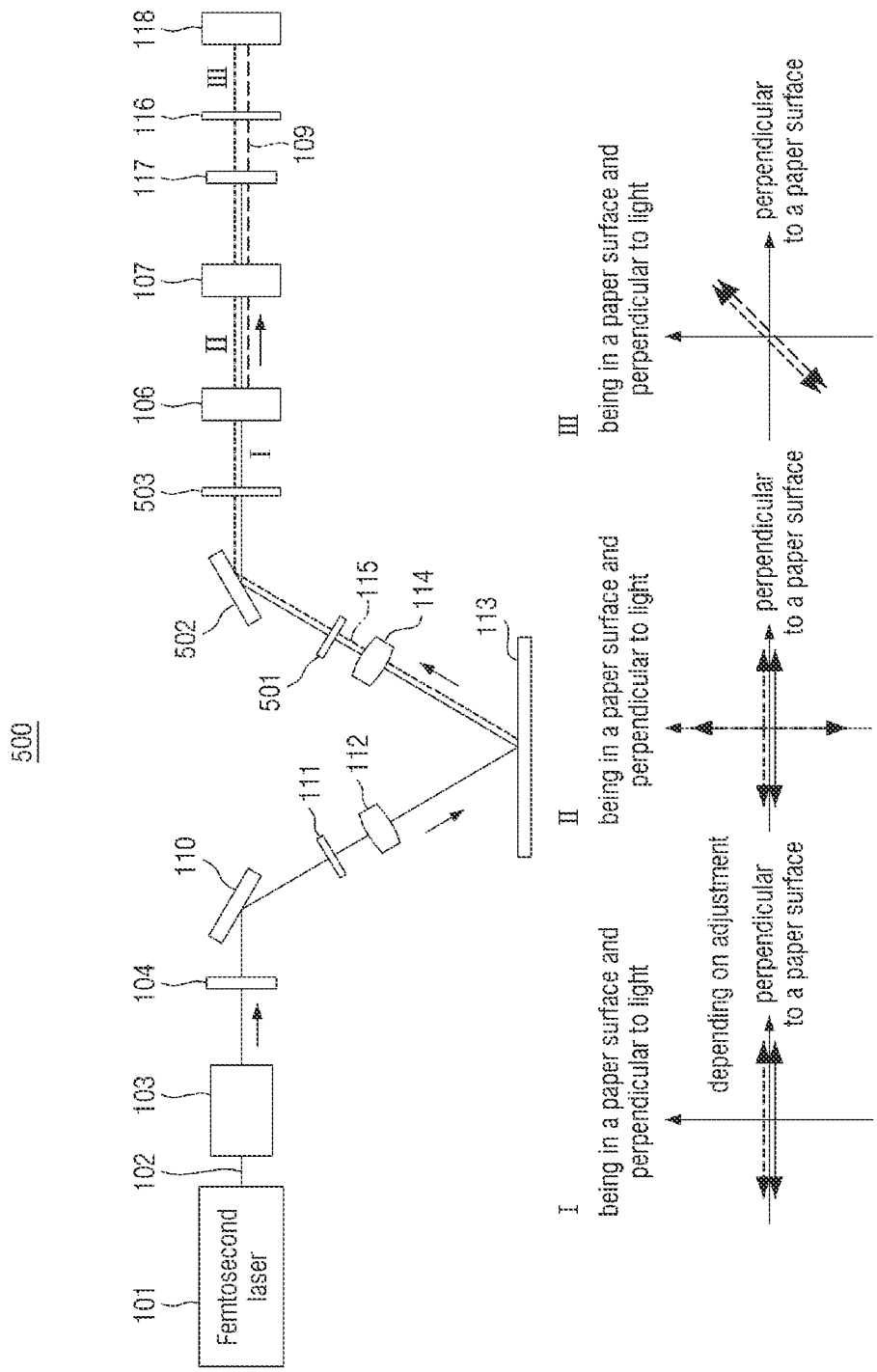
FIG. 5 is a diagram showing a configuration of an optical system of a semiconductor inspecting apparatus according to embodiment 3.

FIG. 5 is a diagram showing a configuration of the optical system of the semiconductor inspecting apparatus according to embodiment 3. Referring to FIG. 5, the optical system of the semiconductor inspecting apparatus according to embodiment 3 is described.

As shown in FIG. 5, an optical system 500 of the semiconductor inspecting apparatus according to embodiment 3 is different from the optical system 100 of the semiconductor inspecting apparatus according to embodiment 1 in that only the fundamental wave is irradiated to the object 113, and the first second-harmonic 109 is generated using the fundamental wave reflected from the object 113.

The optical system 500 of the semiconductor inspecting apparatus according to embodiment 3 includes the femtosecond laser 101, the isolator 103, the intensity modulation element 104, the mirror 110, the third linear polarizer 111, the first light-condensing lens 112, the object 113, the second light-condensing lens 114, a fifth linear polarizer 501, a mirror 502, a sixth linear polarizer 503, the second-harmonic generation element 106, the phase modulation element 107, the short path filter 117, the fourth linear polarizer 116, and the detector 118. The description of the components of the optical system identical with the components of the optical system of embodiment 1 is omitted.

The fifth linear polarizer 501 transmits therethrough only the fundamental wave of the pulsed laser light 102 and a measurement target polarization direction component of the second second-harmonic 115.

The mirror 502 reflects the fundamental wave of the pulsed laser light 102 and the second second-harmonic 115 therefrom. The mirror 502 directs the fundamental wave of the pulsed laser light 102 and the second second-harmonic 115 to an appropriate optical path.

The sixth linear polarizer 503 changes the polarization direction of the fundamental wave of the pulsed laser light 102 parallel to a transmission axis of the fifth linear polarizer 501 such that the second-harmonic generation element 106 efficiently generates the first second-harmonic 109 based on the fundamental wave.

As shown in FIG. 5, at a time point I where the fundamental wave of the pulsed laser light 102 and the second second-harmonic 115 have passed through the sixth linear polarizer 503, the polarization direction of the fundamental wave of the pulsed laser light 102 the polarization direction of the second second-harmonic 115 are aligned with each other. At a time point II at which the first second-harmonic has been generated, the polarization direction of the first second-harmonic 109 is perpendicular to the polarization direction of each of the fundamental wave of the pulsed laser light 102 and the second second-harmonic 115. At a time point III when the first second-harmonic 109 and the second second-harmonic 115 have passed through the fourth linear polarizer 116, the polarization direction of the first second-harmonic 109 and the polarization direction of the second second-harmonic 115 are aligned with each other. As a result, the first second-harmonic 109 and the second second-harmonic 115 have the same wavelength and are coherent with each other and thus interfere with each other.

In the optical system 500 of the semiconductor inspecting apparatus according to embodiment 3, the second-harmonic generation element 106 is disposed in the light-receiving optical system. The phase modulation element 107 is disposed between the second-harmonic generation element 106 and the detector 118.

Using the optical system 500 of the semiconductor inspecting apparatus according to embodiment 3, the drawback that the first second-harmonic 109 changes the electric field state of the semiconductor device as the object 113 to complicate the interpretation of the result may be avoided.

Figure 6:
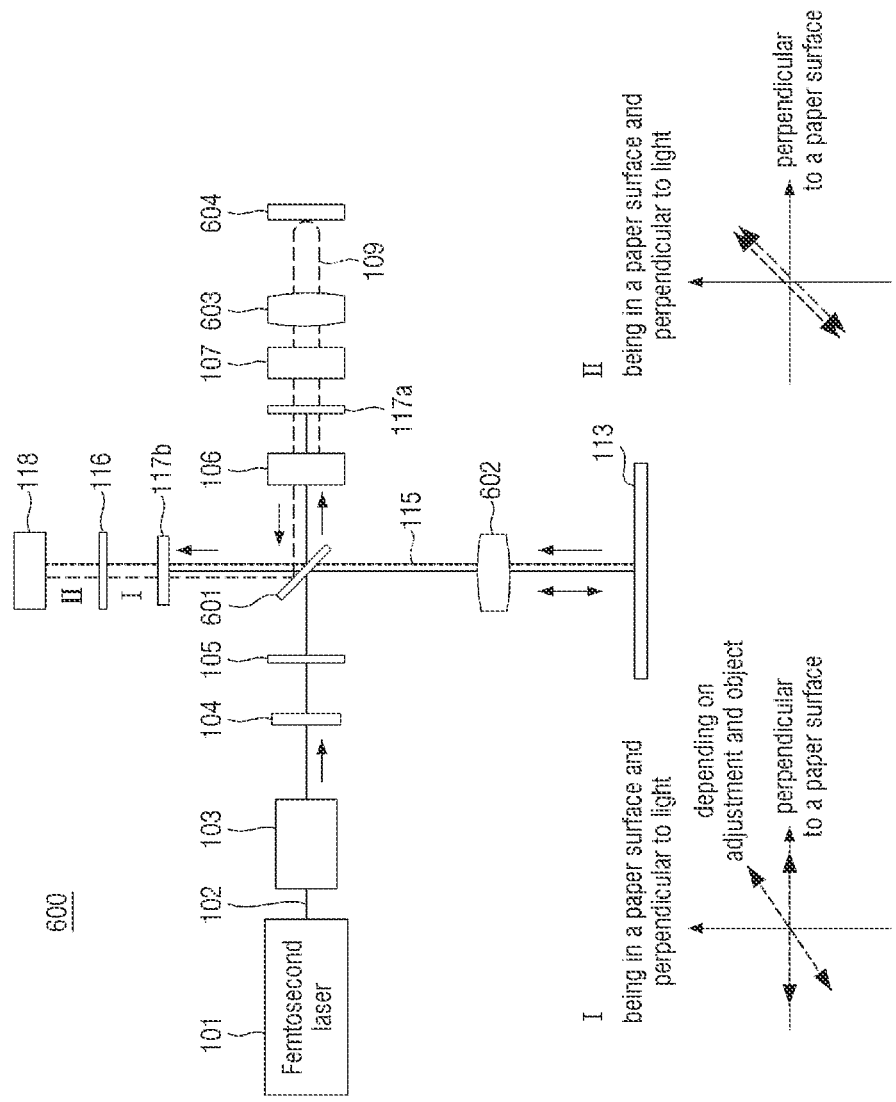
FIG. 6 is a diagram showing a configuration of an optical system of a semiconductor inspecting apparatus according to embodiment 4.

FIG. 6 is a diagram showing a configuration of the optical system of the semiconductor inspecting apparatus according to embodiment 4. Referring to FIG. 6, the optical system of the semiconductor inspecting apparatus according to embodiment 4 is described.

As shown in FIG. 6, an optical system 600 of the semiconductor inspecting apparatus according to embodiment 4 is different from the optical system 100 of the semiconductor inspecting apparatus according to embodiment 1 in that the fundamental wave of the pulsed laser light 102 are divided into two light paths.

The optical system 600 of the semiconductor inspecting apparatus according to embodiment 4 includes the femtosecond laser 101, the isolator 103, the intensity modulation element 104, the first linear polarizer 105, and a beam splitter 601. A measurement light path of the optical system 600 of the semiconductor inspecting apparatus includes an objective lens 602 and the object 113. A reference light path of the optical system 600 of the semiconductor inspecting apparatus includes the second-harmonic generation element 106, a short path filter 117a, the phase modulation element 107, an objective lens 603, and an internal mirror 604. The optical system 600 of the semiconductor inspecting apparatus further includes a short path filter 117b, the fourth linear polarizer 116, and the detector 118 for detecting measurement target light. The description of the components of the optical system identical with the components of the optical system of embodiment 1 is omitted.

The beam splitter 601 amplitude-divides the fundamental wave of the pulsed laser light 102 into the measurement light path and the reference light path. Furthermore, the beam splitter 601 combines the first second-harmonic 109 returned from the reference light path and the second second-harmonic 115 returned from the measurement light path with each other and transmits the combined light to the detector 118.

The objective lens 602 focuses the fundamental wave of the pulsed laser light 102 to a measurement point of the object 113. Furthermore, the objective lens 602 converts the second second-harmonic 115 generated from the object 113 into parallel light.

The short path filter 117a blocks the fundamental wave of the reference light path and transmits only the first second-harmonic 109 therethrough.

The objective lens 603 is a lens for focusing the first second-harmonic 109 on a surface of the internal mirror 604 and converting the reflected first second-harmonic 109 back into parallel light.

The short path filter 117b blocks the fundamental wave of the measurement light path and transmits the first second-harmonic 109 and the second second-harmonic 115 therethrough. The short path filter 117b prevents the fundamental wave from being incident on the detector 118.

As shown in FIG. 6, at a time point I when the first second-harmonic 109 and the second second-harmonic 115 are to be combined with each other by the beam splitter, the polarization direction of the second second-harmonic 115 of the pulsed laser light 102 depend on adjustment and the object 113 and thus is unclear. At a time point II when the first second-harmonic 109 and the second second-harmonic 115 passed through the fourth linear polarizer 116, the polarization direction of the first second-harmonic 109 and the polarization direction of the second second-harmonic 115 are aligned with each other. As a result, the first second-harmonic 109 and the second second-harmonic 115 have the same wavelength and are coherent with each other, and thus interfere with each other.

As shown in FIG. 6, the optical system 600 of the semiconductor inspecting apparatus according to this embodiment 4 is configured to irradiate the light onto the object 113 in a perpendicular manner thereto. The beam splitter 601 of the optical system 600 splits the fundamental wave into a component directed toward the object 113 and a component directed toward the internal mirror 604 on the right. The optical system 600 generates the first second-harmonic 109 using the component of the fundamental wave directed toward the internal mirror. The second second-harmonic 115 generated from the object 113 and the first second-harmonic 109 are brought into having the same optical path again by the beam splitter 601 and then interfere with each other on the detector 118.

In the optical system 600 of the semiconductor inspecting apparatus according to embodiment 4, the beam splitter 601 is disposed between the femtosecond laser 101, which is the light source, and the second-harmonic generation element 106. The pulsed laser light 102 is amplitude-divided into the measurement light path toward the surface of the object 113 and the reference light path. The second-harmonic generation element 106 and the phase modulation element 107 are disposed in the reference light path, and the first second-harmonic 109 is generated from the pulsed laser light 102. The second second-harmonic 115 generated from the surface of the object 113 transmits through the measurement light path, and is brought into being coaxial with the first second-harmonic 109 by the beam splitter 601, and then, both are incident on the detector 118.

The optical system 600 of the semiconductor inspecting apparatus according to embodiment 4 may irradiate the light to the object 113 in a perpendicular thereto. Furthermore, the first second-harmonic 109 does not illuminate the object 113 due to the dichotomy. Thus, the drawback that the first second-harmonic 109 changes the electric field state of the semiconductor device as the object 113 to complicate the interpretation of the result may be avoided.

Figure 7:
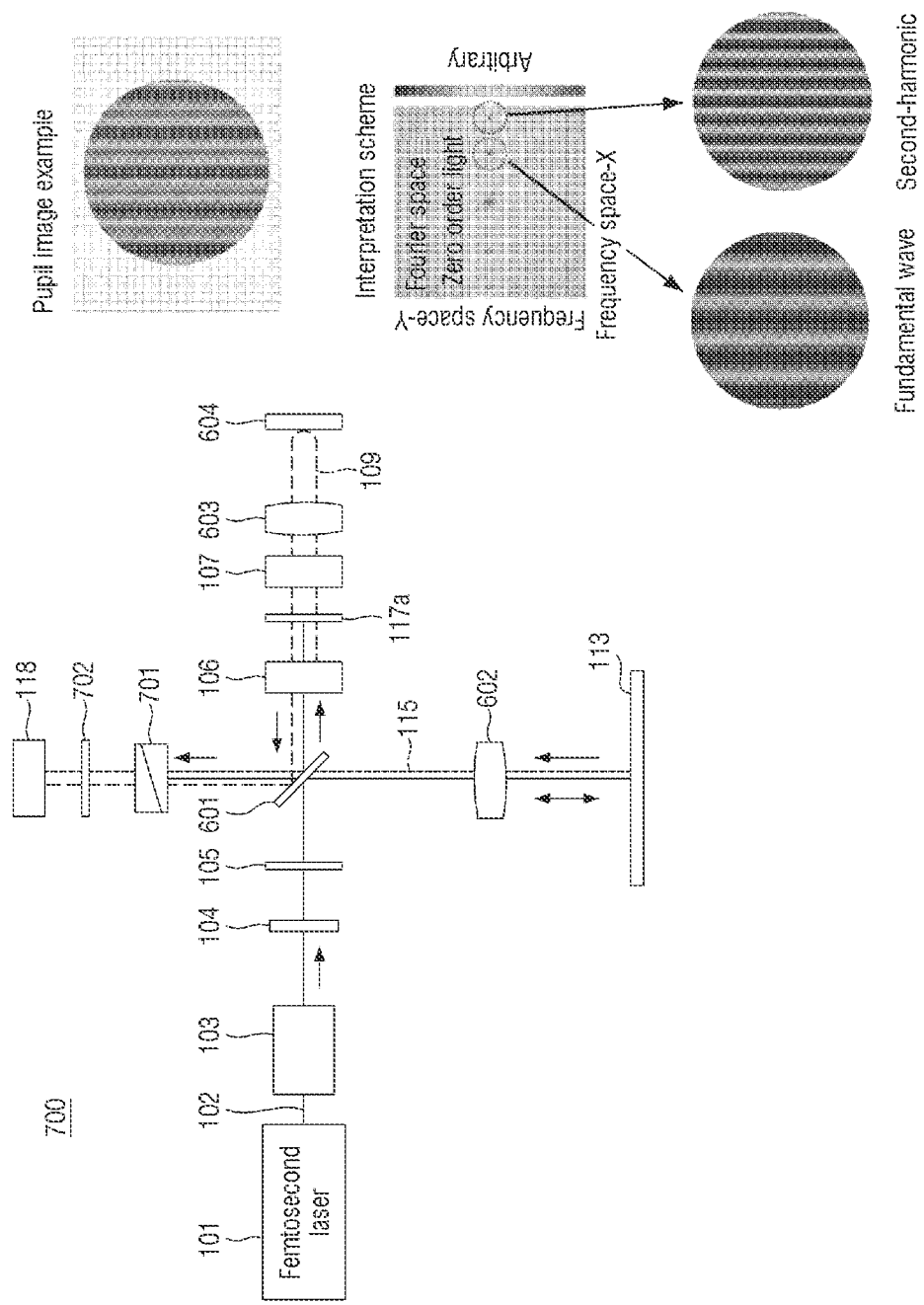
FIG. 7 is a diagram showing a configuration of an optical system of a semiconductor inspecting apparatus according to embodiment 5.
Figure 9:
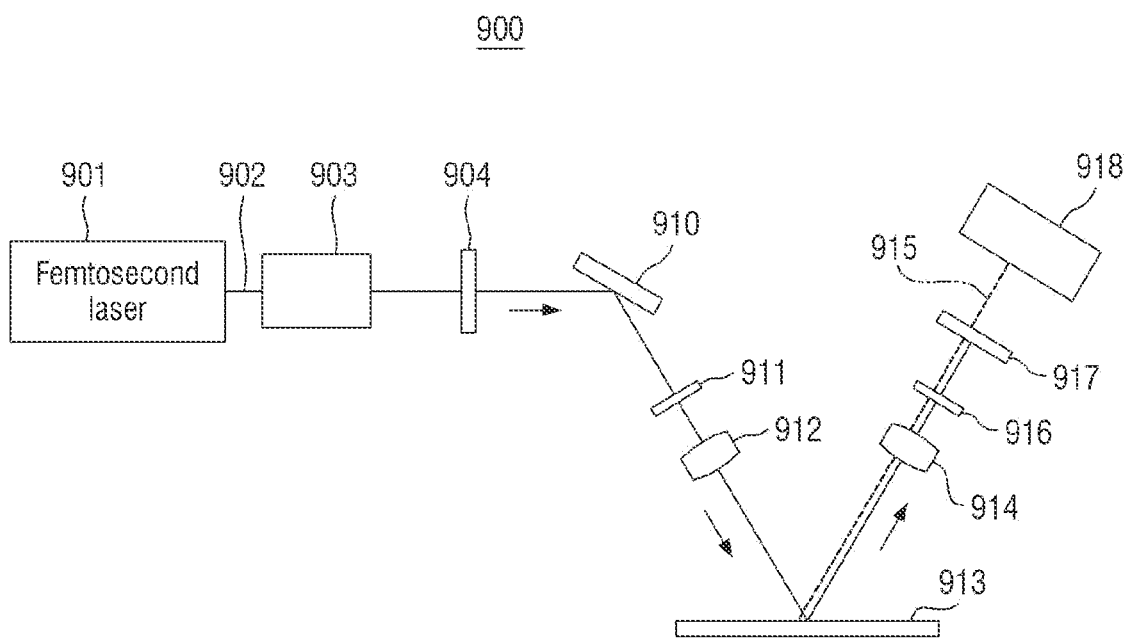
FIG. 9 is a diagram showing a configuration of an optical system of a semiconductor inspecting apparatus using related second-harmonic generation.

FIG. 7 is a diagram showing a configuration of the optical system of the semiconductor inspecting apparatus according to embodiment 5. Referring to FIG. 7, the optical system of the semiconductor inspecting apparatus according to embodiment 5 is described.

An optical system 700 of the semiconductor inspecting apparatus according to embodiment 5 has substantially the same configuration as that of the optical system 600 of the semiconductor inspecting apparatus according to embodiment 4, except that the detector 118 is embodied as an image detector and measures an intensity distribution in a beam.

The optical system 700 of the semiconductor inspecting apparatus according to embodiment 5 includes the femtosecond laser 101, the isolator 103, the intensity modulation element 104, the first linear polarizer 105, and the beam splitter 601. The measurement light path of the optical system 700 of the semiconductor inspecting apparatus includes the objective lens 602 and the object 113. The reference light path of the optical system 700 of the semiconductor inspecting apparatus includes the second-harmonic generation element 106, the short path filter 117a, the phase modulation element 107, the objective lens 603, and the internal mirror 604. The optical system 700 of the semiconductor inspecting apparatus further includes a Nomarski prism 701, an eighth linear polarizer 702, and the detector 118 for detecting measurement target light. The description of the components of the optical system identical with the components of the optical system of each of the embodiments 1 and 4 is omitted.

The Nomarski prism 701 and the eighth linear polarizer 702 may be optical elements for performing interference ellipsometry as disclosed in Japanese Patent Application Publication No. 2021-85698. The Nomarski prism may be replaced with a Wollaston prism. An interference pattern between light beams polarized in a perpendicular to each other is measured before being incident on the Nomarski prism or the Wollaston prism.

As shown in FIG. 7, at a time point I at which the fundamental wave of the pulsed laser light 102, the first second-harmonic 109, and the second second-harmonic 115 are to be combined with each other by the beam splitter, the polarization direction of each of the fundamental wave of the pulsed laser light 102 and the second second-harmonic 115 depends on the adjustment and the object 113 and thus is unclear. At a time point II when the fundamental wave of the pulsed laser light 102, the first second-harmonic 109, and the second second-harmonic 115 passed through the fourth linear polarizer 116, the polarization direction of the fundamental wave of the pulsed laser light 102, the polarization direction of the first second-harmonic 109, and the polarization direction of the second second-harmonic 115 are aligned with each other. As a result, the first second-harmonic 109 and the second second-harmonic 115 have the same wavelength and are coherent with each other and thus interfere with each other.

In the optical system 700 of the semiconductor inspecting apparatus according to embodiment 5, the short path filter 117b disposed between the beam splitter 601 and the fourth linear polarizer 116 is removed, such that the fundamental wave is incident on the detector 118. The optical system 700 of the semiconductor inspecting apparatus according to embodiment 5 further includes the Nomarski prism 701 and the eighth linear polarizer 702 in front of the image detector 118.

Since the optical system 700 of the semiconductor inspecting apparatus according to embodiment 5 does not have the short path filter 117b, the optical system 700 can obtain a signal with high intensity.

In the optical systems according to embodiments 2 to 5, the optical distance from the light source to the detector 118 along which the pulsed laser light 102 and the first second-harmonic 109 travel may be equal to the optical distance from the light source to the detector 118 along which the pulsed laser light 102 and the second second-harmonic 115 travel.

The present disclosure relates to semiconductor inspection and measurement technology using the second-harmonic, which significantly improves the performance of measuring metal contamination on the surface of the semiconductor device, the amount of dopant in the transistor, or the crystallization state after annealing. The measurement apparatus using the second-harmonic according to the present disclosure is expected to improve throughput by more than one order of magnitude, and is expected to be utilized efficiently in both research and development of the semiconductor device and monitoring in mass production thereof, via commercialization, thereby contributing to shortening the development cycle and improving the product yield.

Further, the present disclosure is not limited to the above embodiments, and may be subjected to appropriate modifications without departing from the purpose. In the embodiments 1 to 5, a second light source may be provided that emits light having a photon energy greater than a minimum ionization energy of the material constituting the object 113. The light of this second light source is irradiated to an area containing a position of the surface of the object 113 to which the pulsed laser light is irradiated. In this way, the surface excited state of the object 113 may be observed. Furthermore, the charging of the surface of the object 113 may be saturated, such that the second-harmonic may be measured in a relatively short time.

Although embodiments of the present disclosure have been described with reference to the accompanying drawings, the present disclosure is not limited to the above embodiments, and instead may be implemented in various different forms. A person skilled in the art may appreciate that the present disclosure may be practiced in other concrete forms without changing the technical spirit or essential characteristics of the present disclosure. Therefore, it should be appreciated that the embodiments as described above are not restrictive but illustrative in all respects.

What is claimed is:

1. An apparatus for inspecting a surface of an object, the apparatus comprising:
   a light source for emitting pulsed laser light of a predetermined wavelength;
   a second-harmonic generation element configured to generate a first second-harmonic of the pulsed laser light;
   a phase modulation element configured to modulate a phase of the first second-harmonic at a predetermined frequency;
   a lighting optical system configured to irradiate the pulsed laser light and the first second-harmonic onto the surface of the object, the object receiving the pulsed laser light irradiated thereto to generate a second second-harmonic;
   a light-receiving optical system configured to allow the first second-harmonic and the second second-harmonic to be incident on a detector while the first second-harmonic and the second second-harmonic are coaxial with each other; and
   the detector configured to receive the first second-harmonic and the second second-harmonic and convert the first second-harmonic and the second second-harmonic into an electrical signal,
   wherein an intensity of the second second-harmonic is obtained from an amplitude of the electrical signal having a modulated intensity.

2. The apparatus of claim 1, wherein a polarizer is disposed in front of the detector,
   wherein the polarizer allows a polarized state of the first second-harmonic and a polarized state of the second second-harmonic to be identical with each other.

3. The apparatus of claim 1, wherein an optical distance from the light source to the detector along which the pulsed laser light and the first second-harmonic generated using the pulsed laser light travel is equal to an optical distance from the light source to the detector along which the pulsed laser light and the second second-harmonic generated using the pulsed laser light travel.

4. The apparatus of claim 1, wherein the pulsed laser light has a pulse width of 1 picosecond or smaller.

5. The apparatus of claim 1, wherein the electrical signal is lock-in detected by the detector at a modulation frequency of the phase modulation element.

6. The apparatus of claim 1, wherein a light-condensing optical element is disposed in the lighting optical system so that the pulsed laser light is focused on the surface of the object.

7. The apparatus of claim 1, wherein the object is a semiconductor element undergoing a manufacturing process.

8. The apparatus of claim 1, wherein a short pass filter configured to remove the pulsed laser light of the predetermined wavelength is disposed between the detector and the object.

9. The apparatus of claim 1, wherein the second-harmonic generation element includes a nonlinear optical crystal satisfying a phase matching condition of a type I for generating the first second-harmonic having linear polarization,
   wherein the phase modulation element includes an electric optical element (EOM) configured to modulate a phase of only the first second-harmonic.

10. The apparatus of claim 1, wherein the second-harmonic generation element and the phase modulation element are disposed in the lighting optical system,
    wherein the first second-harmonic is reflected from the surface of the object.

11. The apparatus of claim 1, wherein the second-harmonic generation element is disposed in the lighting optical system,
    wherein the first second-harmonic generated from the second-harmonic generation element is separated from the pulsed laser light of the predetermined wavelength by a beam splitter,
    wherein the separated pulsed laser light of the predetermined wavelength is irradiated onto the surface of the object,
    wherein the separated first second-harmonic passes through the phase modulation element,
    wherein the first second-harmonic having passed through the phase modulation element is made coaxial with the second second-harmonic generated from the surface of the object by a beam splitter, and then the first second-harmonic and the second second-harmonic are incident on the detector.

12. The apparatus of claim 1, wherein the second-harmonic generation element is disposed in the light-receiving optical system,
wherein the phase modulation element is disposed between the second-harmonic generation element and the detector.

13. The apparatus of claim 1, wherein a beam splitter is disposed between the light source and the second-harmonic generation element,
wherein the pulsed laser light is amplitude-divided into a reference light path and a measurement light path toward the surface of the object,
wherein the second-harmonic generation element and the phase modulation element are disposed in the reference light path, and the first second-harmonic is generated from the pulsed laser light,
wherein the second second-harmonic generated from the surface of the object transmits through the measurement light path, and is made coaxial with the first second-harmonic by the beam splitter and then, the second second-harmonic and the first second-harmonic are incident on the detector.

14. The apparatus of claim 13, wherein the detector includes an image detector,
wherein a set of a Nomarski prism or a Wollaston prism and a linear polarizer is disposed in front of the image detector,
wherein an interference pattern between light beams polarized in a perpendicular manner to each other before being incident on the Nomarski prism or the Wollaston prism is measured.

15. The apparatus of claim 1, further comprising a second light source for emitting light having a photon energy greater than a minimum ionization energy of a material constituting the object,
wherein the light from the second light source is irradiated onto an area containing a position on the surface of the object to which the pulsed laser light is irradiated.

16. The apparatus of claim 1, wherein at least one of a thickness of a $SiO_2$ film on a semiconductor surface, metal contamination of $SiO_2$, an amount of defects at a boundary between $SiO_2$ and a semiconductor substrate, an amount of dopant impurities in the semiconductor substrate, or a recrystallized state of the semiconductor substrate is calculated based on the intensity of the second second-harmonic.

17. An apparatus for inspecting a surface of an object, the apparatus comprising:
a light source for emitting pulsed laser light of a predetermined wavelength;
a second-harmonic generation element configured to generate a first second-harmonic of the pulsed laser light;
a phase modulation element configured to modulate a phase of the first second-harmonic at a predetermined frequency;
a lighting optical system configured to irradiate the pulsed laser light and the first second-harmonic onto the surface of the object, the object receiving the pulsed laser light irradiated thereto to generate a second second-harmonic; and
a light-receiving optical system including a detector and a short pass filter, and configured to allow the first second-harmonic and the second second-harmonic to be incident on the detector while the first second-harmonic and the second second-harmonic are coaxial with each other,
wherein the detector is configured to receive the first second-harmonic and the second second-harmonic and convert the first second-harmonic and the second second-harmonic into an electrical signal, and
wherein the short pass filter is configured to remove the pulsed laser light of the predetermined wavelength.

18. The apparatus of claim 17, wherein an intensity of the second second-harmonic is obtained from an amplitude of the electrical signal having a modulated intensity.

19. The apparatus of claim 17, further comprising:
a polarizer disposed in front of the detector,
wherein the polarizer allows a polarized state of the first second-harmonic and a polarized state of the second second-harmonic to be identical with each other.

20. An apparatus for inspecting a surface of an object, the apparatus comprising:
a light source for emitting pulsed laser light of a predetermined wavelength through an isolator;
an intensity modulator configured to change an intensity of the pulsed laser light;
a second-harmonic generation element configured to generate a first second-harmonic of the pulsed laser light based on an output of the intensity modulator;
a phase modulation element configured to modulate a phase of the first second-harmonic at a predetermined frequency;
a lighting optical system configured to irradiate the pulsed laser light and the first second-harmonic onto the surface of the object, the object receiving the pulsed laser light irradiated thereto to generate a second second-harmonic; and
a light-receiving optical system including a detector and a polarizer, and configured to allow the first second-harmonic and the second second-harmonic to be incident on the detector while the first second-harmonic and the second second-harmonic are coaxial with each other,
wherein the detector is configured to receive the first second-harmonic and the second second-harmonic and convert the first second-harmonic and the second second-harmonic into an electrical signal, and
the polarizer allows a polarized state of the first second-harmonic and a polarized state of the second second-harmonic to be identical with each other.

\* \* \* \* \*